United States Patent
Han et al.

(10) Patent No.: US 11,839,127 B2
(45) Date of Patent: Dec. 5, 2023

(54) LIGHT EMITTING DISPLAY DEVICE WITH ELECTRON INJECTION LAYER AT NON-ACTIVE AREA

(71) Applicant: LG DISPLAY CO., LTD., Seoul (KR)

(72) Inventors: Kyu Il Han, Paju-si (KR); Mi So Kim, Seoul (KR); Hwa Yong Shin, Goyang-si (KR); Ji Hyung Lee, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 17/336,903

(22) Filed: Jun. 2, 2021

(65) Prior Publication Data

US 2022/0208875 A1 Jun. 30, 2022

(30) Foreign Application Priority Data

Dec. 31, 2020 (KR) .......................... 10-2020-0190050

(51) Int. Cl.
*H01L 27/32* (2006.01)
*H01L 51/50* (2006.01)
*H10K 59/35* (2023.01)
*H10K 50/15* (2023.01)
*H10K 50/16* (2023.01)
*H10K 50/17* (2023.01)
*H10K 59/122* (2023.01)
*H10K 59/131* (2023.01)

(52) U.S. Cl.
CPC .......... *H10K 59/353* (2023.02); *H10K 50/15* (2023.02); *H10K 50/16* (2023.02); *H10K 50/171* (2023.02); *H10K 59/122* (2023.02); *H10K 59/131* (2023.02)

(58) Field of Classification Search
CPC ............. H01L 27/3218; H01L 27/3246; H01L 27/3276; H01L 51/5056; H01L 51/5072; H01L 51/5092
See application file for complete search history.

(56) References Cited

U.S. PATENT DOCUMENTS

| | | | |
|---|---|---|---|
| 2005/0005848 A1 | 1/2005 | Yamazaki et al. | |
| 2011/0163331 A1* | 7/2011 | Yamazaki | H10K 50/14 257/E51.018 |
| 2014/0264315 A1* | 9/2014 | Ono | H01L 51/5228 257/40 |
| 2014/0299867 A1* | 10/2014 | Ono | H10K 50/824 257/40 |
| 2016/0322441 A1* | 11/2016 | Kim | H10K 59/122 |
| 2017/0155078 A1* | 6/2017 | Lee | H01L 27/3258 |
| 2017/0278910 A1 | 9/2017 | Choi et al. | |
| 2019/0157618 A1* | 5/2019 | Park | H01L 51/5253 |
| 2020/0194520 A1* | 6/2020 | Seo | H01L 27/3216 |

(Continued)

FOREIGN PATENT DOCUMENTS

| | | |
|---|---|---|
| CN | 102668708 A | 9/2012 |
| CN | 103907397 A | 7/2014 |

(Continued)

*Primary Examiner* — Peter Bradford
(74) *Attorney, Agent, or Firm* — Birch, Stewart, Kolasch & Birch, LLP

(57) ABSTRACT

Disclosed is a light emitting display device which prevents pixel shrinkage and improves reliability by changing the structure of a bank and the inner structures of light emitting devices outside an active area of the light emitting display device.

22 Claims, 7 Drawing Sheets

(56) References Cited

U.S. PATENT DOCUMENTS

2020/0264723 A1    8/2020   Tanaka
2021/0376279 A1*  12/2021   Jeon .................... H01L 51/5096

FOREIGN PATENT DOCUMENTS

| | | |
|---|---|---|
| CN | 206947384 U | 1/2018 |
| CN | 111326555 A | 6/2020 |
| DE | 10 2019 134 189 A1 | 6/2020 |
| JP | 2007-157374 A | 6/2007 |
| JP | 2019-3189 A | 1/2019 |
| KR | 10-2020-0072177 A | 6/2020 |
| KR | 10-2020-0072852 A | 6/2020 |
| KR | 10-2020-0072945 A | 6/2020 |
| WO | WO 2009/150802 A1 | 12/2009 |
| WO | WO2013/069041 A1 | 5/2013 |
| WO | WO 2013/069042 A1 | 5/2013 |

* cited by examiner

A

B

A

B

LIGHT EMITTING DISPLAY DEVICE WITH ELECTRON INJECTION LAYER AT NON-ACTIVE AREA

CROSS-REFERENCE TO RELATED APPLICATIONS

This application claims the priority benefit of Korean Patent Application No. 10-2020-0190050, filed in the Republic of Korea on Dec. 31, 2020, the entire contents of which are hereby expressly incorporated by reference as if fully set forth herein into the present application.

BACKGROUND OF THE INVENTION

Field of the Invention

The present invention relates to a display device, and more particularly, to a light emitting display device which can prevent pixel shrinkage and improve reliability of the display device through changes in structures outside an active area of the display device.

Discussion of the Related Art

Recently, self-light emitting display devices which achieve device compactness and clear color display without requiring a separate light source, are being considered as a competitive application.

The self-light emitting display device includes light emitting devices which are independently driven in respective subpixels. The light emitting devices can be divided into organic light emitting devices and inorganic light emitting devices depending on the materials provided in the light emitting devices.

In a display device including the organic light emitting devices, however, inner organic layers can be weak to moisture or the like, and thus, the reliability and lifespan of the display device can be lowered due to the moisture penetration into the inner organic layers.

SUMMARY OF THE INVENTION

Accordingly, the present invention is directed to a light emitting display device, configured to prevent pixel shrinkage and improve reliability by changing in the structure of a bank and the inner structures of light emitting devices outside an active area, that substantially obviates one or more problems due to limitations and disadvantages of the related art.

An object of the present invention is to provide a light emitting display device which can prevent moisture penetration through a bank hole by changing the structure of the bank hole, configured to correspond to a power voltage line so as to apply a power supply voltage signal to a cathode, and the configuration of extensions of respective layers of light emitting devices outside an active area.

Additional advantages, objects, and features of the invention will be set forth in part in the description which follows and in part will become apparent to those having ordinary skill in the art upon examination of the following or can be learned from practice of the invention. The objectives and other advantages of the invention can be realized and attained by the structure particularly pointed out in the written description and claims hereof as well as the appended drawings.

To achieve these objects and other advantages and in accordance with the purpose of the invention, as embodied and broadly described herein, a light emitting display device includes a substrate configured to have an active area and a non-active area, a plurality of light emitting devices provided in subpixels within the active area, a first voltage line provided within the non-active area along an edge of the active area of the substrate, and a bank configured to expose emission parts of the light emitting devices through a plurality of first holes formed in the active area and to expose the voltage line through a second hole formed in the non-active area, wherein a cathode of the light emitting devices is connected to the first voltage line through the second hole.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE EMBODIMENTS

Figure 1:
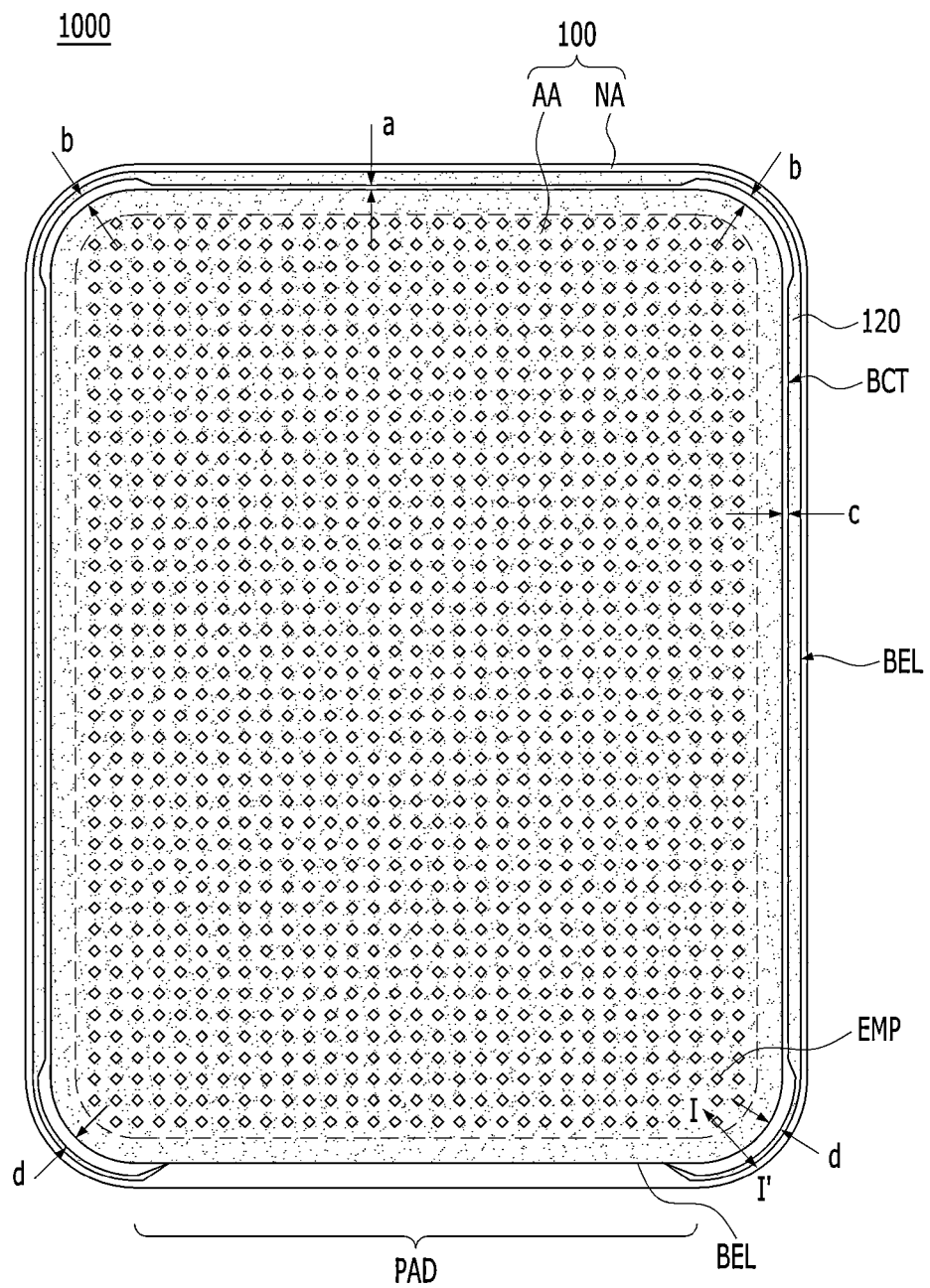
FIG. 1 is a plan view illustrating a light emitting display device according to one embodiment of the present invention.

Reference will now be made in detail to the exemplary embodiments of the present invention, examples of which are illustrated in the accompanying drawings. In the following description of the embodiments and the drawings, the same or similar elements are denoted by the same reference numerals throughout the specification. In the following description of the embodiments of the present invention, a detailed description of known functions and configurations incorporated herein will be omitted when it can make the subject matter of the present invention rather unclear. Further, the names of elements used in the following description of the embodiments of the present invention are selected in consideration of ease of preparation of the specification, and can thus differ from the names of parts of an actual product.

The shapes, sizes, ratios, angles and numbers of elements given in the drawings to describe the embodiments of the present invention are merely exemplary, and thus, the present invention is not limited to the illustrated details. In the following description of the embodiments, the terms "including", "comprising" and "having" are to be interpreted as indicating the presence of one or more other characteristics, numbers, steps, operations, elements or parts stated in the specification or combinations thereof, and do not exclude the presence of other characteristics, numbers, steps, operations, elements, parts or combinations thereof, or the possibility of adding the same, unless the term "only" is used. It will be understood that a singular expression of an element(s) encompasses a plural expression unless stated otherwise.

In the interpretation of elements included in the various embodiments of the present invention, it is to be interpreted that the elements include error ranges unless stated otherwise.

In the following description of the embodiments, it will be understood that, when positional relationships are expressed, for example, when an element is said to be "on", "above", "under" or "beside" another element, the two elements can directly contact each other, or one or more other elements can be interposed between the two elements, unless the term "just" or "directly" is used.

In the following description of the embodiments, it will be understood that, when temporal relationships are expressed, for example, when terms expressing a sequence of events, such as "after", "subsequent to", "next" and "before" are used, the terms encompass both a continuous relationship between the events and a discontinuous relationship between the events, unless the term "just" or "directly" is used.

In the following description of the embodiments, it will be understood that, when the terms "first", "second", etc. are used to describe various elements, these terms are used merely to distinguish the same or similar elements. Therefore, a first element described hereinafter could be termed a second element without departing from the technical scope of the invention.

Respective features of the various embodiments of the present invention can be partially or wholly coupled to or combined with each other and be interlocked or driven in various technical manners, and the respective embodiments can be implemented independently of each other or be implemented together through connection therebetween.

Hereinafter, a light emitting display device according to one or more embodiments of the present invention will be described. All the components of the light emitting display device according to all embodiments of the present invention are operatively coupled and configured.

Figure 2:
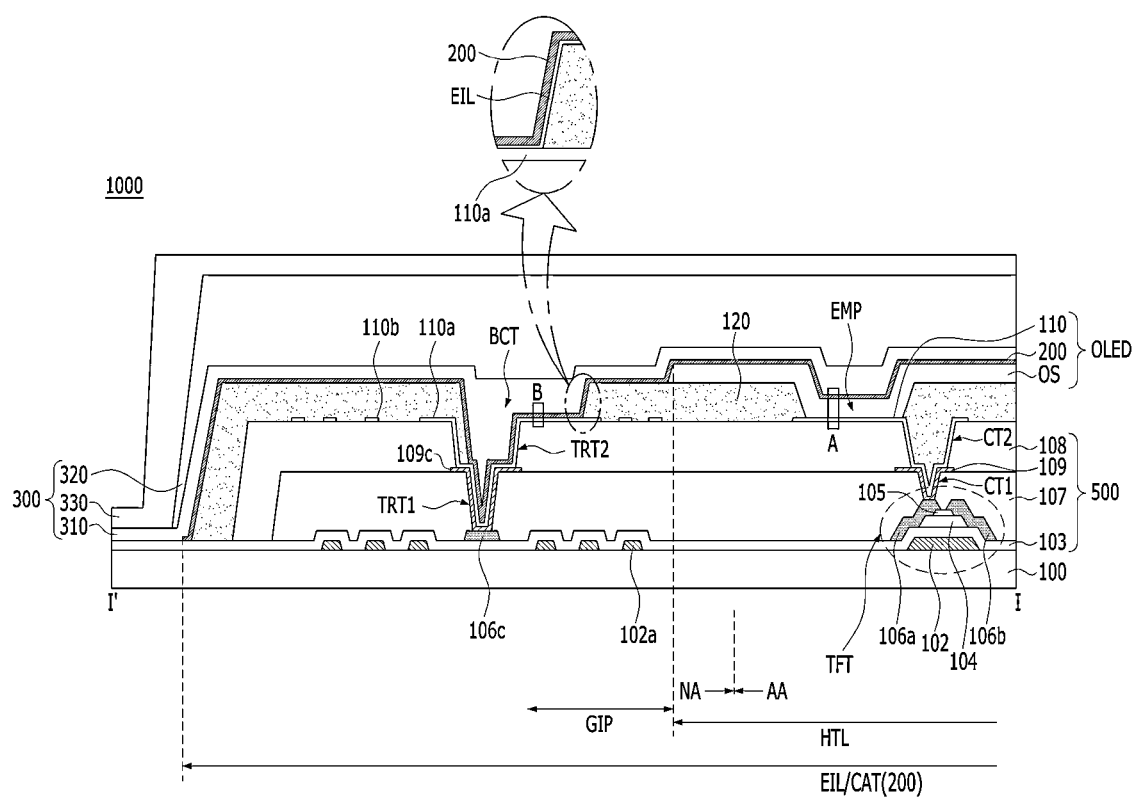
FIG. 2 is a cross-sectional view of the light emitting display device of FIG. 1, taken along line I-I' in FIG. 1.
Figure 3A:
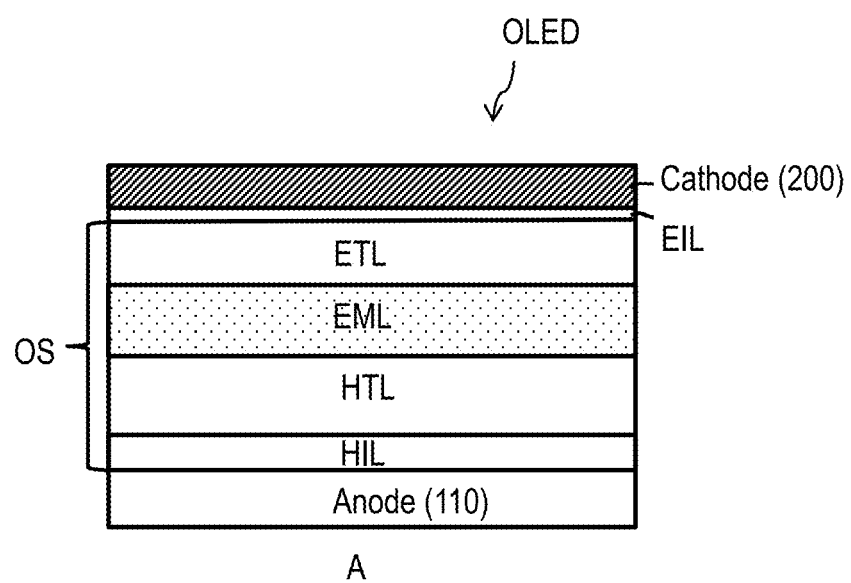
FIGS. 3A and 3B are cross-sectional views illustrating a region A and a region B shown in FIG. 2, respectively.
Figure 3B:
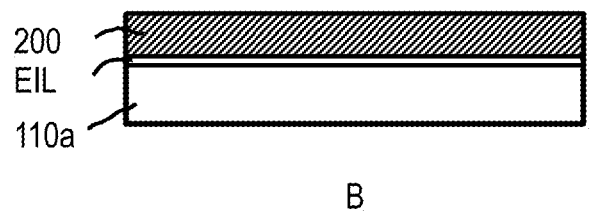

FIG. 1 is a plan view illustrating a light emitting display device according to one embodiment of the present invention, FIG. 2 is a cross-sectional view of FIG. 1, taken along line I-I', and FIGS. 3A and 3B are cross-sectional views respectively illustrating a region A and a region B shown in FIG. 2.

As shown in FIGS. 1 and 2, a light emitting display device 1000 according to one embodiment of the present invention can include a substrate 100 having an active area AA and a non-active area NA, light emitting devices (e.g., OLED) respectively provided in a plurality of subpixels in the active area AA, a first power supply voltage line 106c provided in the non-active area NA along the edge of the active area AA, and a bank 120 configured to expose emission parts of the respective light emitting devices OLED through a plurality of first holes EMP in the active area AA and to expose the first power supply voltage line 106c through a second hole BCT in the non-active area NA, and an electron injection layer EIL of the light emitting devices OLED can extend from the active area AA so as to be provided at least in the second hole BCT of the non-active area NA.

For example, the electron injection layer EIL is formed to directly contact the side part of the bank 120 which is exposed to the inside of the second hole BCT, thereby being capable of preventing some of moisture remaining in the second hole BCT from penetrating through the bank 120 during inflow of external moisture or during cooling. The electron injection layer EIL is formed to overlap the second hole BCT, and thus protects the second hole BCT and a region therearound.

The electron injection layer EIL is formed not only on the side part of the second hole BCT but also further extends onto the upper surface of the bank 120 around the second hole BCT. For an example, the electron injection layer EIL may come into contact with the bank 120 at side of the second hole BCT and an upper part of the bank 120 within the non-active area NA, thereby being capable of protecting the upper surface of the bank 120.

The electron injection layer EIL can be formed in the same chamber and/or using the same mask as a cathode (CAT) 200 of the light emitting devices OLED, and the cathode 200 is provided on the electron injection layer EIL.

The second hole BCT is substantially provided so that the cathode 200 overlaps with the first power supply voltage line 106c, and the first power supply voltage line 106c can be connected to the cathode 200 by the electron injection layer EIL inside the second hole BCT. For the purpose conductive connection, the electron injection layer EIL includes an inorganic material or an inorganic compound including a metal. For example, the electron injection layer EIL can include at least one of LiF, Yb, Ag and Mg, and in addition, can include some of components of the cathode 200. The electron injection layer EIL serves to facilitate injection of electrons from the cathode 200 into organic layers OS inside the light emitting devices OLED, and for this purpose, can include a metal having a low interfacial resistance with the organic layers OS and a small work function. Further, the electron injection layer EIL is formed not to be excessively thick, thereby preventing an increase in the conductive connection resistance between the cathode 200 and the first power supply voltage line 106c provided thereunder.

Now, the function of the electron injection layer EIL in the light emitting display device 1000 according to the present invention will be described in brief.

For example, if the electron injection layer EIL includes ytterbium (Yb), when moisture flows into the second hole BCT, ytterbium (Yb) reacts with a hydroxyl group to produce hydrogen molecules, as set forth in Formula 1 below, the hydrogen molecules are released to the outside, and thereby, an influence of moisture can be eliminated.

Further, if the electron injection layer EIL includes lithium fluoride (LiF), when moisture flows into the second hole BCT, lithium fluoride (LiF) is electrically split into lithium (Li) and fluorine (F), lithium (Li) reacts with a hydroxyl group to produce hydrogen fluoride (HF), as set forth in Formula 2 below, hydrogen fluoride (HF) is released to the outside, and thereby, an influence of moisture can be eliminated.

$$2Yb + 6H_2O \rightarrow 2Yb(OH)_3 + 3H_2 \qquad \text{[Formula 1]}$$

$$LiF + H_2O \rightarrow LiOH + HF \qquad \text{[Formula 2]}$$

For example, in the light emitting display device 1000 according to the present invention, the electron injection layer EIL formed to cover the second hole BCT reacts with moisture from the outside or moisture generated during cooling and releases hydrogen or hydrogen fluoride (HF) to the outside, thereby being capable of eliminating an influence of moisture and preventing shrinkage of the emission parts of the subpixels due to moisture.

FIG. 1 illustrates the shape of the bank 120 of the light emitting display device. The bank 120 can be formed in or as an integral type, as shown in FIG. 1, and can have the first holes EMP and the second hole BCT, which are formed in the inner region of the bank 120 so as to be spaced apart from each other. The bank 120 is formed of an insulating organic material, and has an end line BEL which is spaced apart inwards from the edge of the substrate 100 by a designated width. The reason why the end line BEL of the bank 120 is spaced apart from the edge of the substrate 100 is to prevent the side part of the edge of the bank 120, which is formed of an organic material, from directly contacting ambient air, and to prevent moisture from penetrating thereinto. Further, the second hole BCT is not formed in a region of the bank 120 corresponding to a pad part PAD. The side of the bank 120 on which the pad part PAD is formed can have the end line BEL farther inward than the other sides of the bank 120 in order to realize connection between pad electrodes of the pad part PAD and a drive integrated circuit (IC) or a flexible printed circuit board (FPCB) including the drive IC. In this case, the pad electrodes on the substrate 100, from which the bank 120 is removed, and the first power supply voltage line 106c can be connected to each other in the pad part PAD.

The first holes EMP of the bank 120, which correspond to the emission parts in the active area AA, are spaced apart from one another, the bank 120 is provided in a region of the active area AA other than the first holes EMP, and the light emitting devices OLED emit light through the first holes EMP. The bank 120 surrounds the first holes EMP, and can distinguish the emission parts and non-emission parts from each other using a height difference between.

Further, the sizes of the first holes EMP can differ depending on the colors of light emitted by the subpixels. For example, the first hole EMP in a blue subpixel can have a greater size than that of the first hole EMP in the green subpixel or that of the first hole EMP in the red subpixel. The sizes of the first holes EMP in the respective subpixels can be adjusted in consideration of the luminous efficiencies of the respective light emitting devices OLED, a required driving voltage, and the degree of human color perception. The size variation in the first holes EMP of the blue, red and green (or other colors) sub-pixels can be a width/length and/or depth variation.

The second hole BCT is provided in an integral type within the non-active area NA except for the pad part PAD, the first power supply voltage line 106c is disposed under the second hole BCT, and the cathode 200 of the light emitting devices OLED is connected to the upper portion of the second hole BCT so as to form an electrically conducting state therewith. The first power supply voltage line 106c extends to the pad part PAD, and can thus receive a signal applied from a driver connected to the pad part PAD.

The signal applied to the first power supply voltage line 106c is a ground voltage or a low-power supply voltage signal, and the cathode 200 can maintain a designated potential by the ground voltage or the low-power supply voltage signal applied to the cathode 200.

The light emitting devices OLED are selectively driven by receiving an electrical signal through thin film transistors TFT connected to anodes 110 which are patterned per subpixel, and thus perform light emission from the corresponding subpixels.

For example, the thin film transistor TFT includes, as shown in FIG. 2, a gate electrode 102, a semiconductor layer 104 overlapping the gate electrode 102, and a source electrode 106a and a drain electrode 106b connected to both sides of the semiconductor layer 104.

A gate insulating film 103 is provided between the gate electrode 102 and the semiconductor layer 104, a channel protective layer 105 is provided on the channel of the semiconductor layer 104, and channel protective layer 105 protects the channel when the semiconductor layer 104 is connected to the source electrode 106a and the drain electrode 106b.

The semiconductor layer 104 can include at least one of an oxide semiconductor layer, a polysilicon layer and an amorphous silicon layer, and in some cases, can be formed by stacking two or more layers formed of the same material or different materials among the above-described materials.

A first planarization film 107 can be provided so as to protect the thin film transistor TFT. A first contact hole CT1 can be formed through the first planarization film 107 so as to expose the source electrode 106a of the thin film transistor TFT.

Further, a first connection metal pattern 109 which is connected to the source electrode 106a through the first contact hole CT1 can be provided.

In addition, a second planarization film 108 can be provided so as to cover the first connection metal pattern 109, and a second contact hole CT2 can be formed through the second planarization film 108 so as to expose the first connection pattern 109.

The anode 110 connected to the first connection metal pattern 109 through the second contact hole CT2 and the first contact hole CT1 is provided.

Here, all elements provided under the light emitting device OLED, i.e., under the anode 110, can form a thin film transistor array substrate 500. The thin film transistor array substrate 500 can include the thin film transistors TFT, the gate insulating film 103 provided between the electrodes of the thin film transistors TFT, the first and second planarization films 107 and 108, and the first connection metal pattern 109.

When the thin film transistor array substrate 500 is formed, signal lines 102a can be further provided in the same layer as the gate electrode 102, and the first power supply voltage line 106c can be further provided in the same layer as the source and drain electrodes 106a and 106b.

Although FIG. 2 illustrates the first power supply voltage line 106c alone in order to focus on the description of a line connected to the cathode 200, other power supply voltage lines, which transmit voltages other than the low-power supply voltage or the ground voltage, i.e., a high-power supply voltage or a reference voltage, can be further provided.

The first power supply voltage line 106c can be provided in the same layer as the source and drain electrodes 106a and 106b, as shown in the figures, or can be provided in the same layer as the gate electrode 102.

The signal lines 102a can be connected to gate lines provided in the active area AA, or can be connected to gate drivers GIP provided in the non-active area NA located at both sides of the active area AA.

The thin film transistor TFT, which is connected to the light emitting device OLED, is substantially a driving thin film transistor, and in addition to the driving thin film transistor, other thin film transistors, such as a switching thin film transistor, can be further provided. In order to enable the driving thin film transistor and the switching thin film transistor to exhibit different functions, at least one of the electrodes of the driving thin film transistor and the switching thin film transistor can be located in different layers, for example, a metal pattern provided in the same layer as the first connection metal pattern 109 located on the first planarization film 107 can be used as electrodes of the driving thin film transistor and other thin film transistors. In some cases, the first connection metal pattern 109 can be omitted, and the anode 110 can be directly connected to the source electrode 106a.

A second connection metal pattern 109c connected to the first power supply voltage line 106c can be further provided in the same layer as the first connection metal pattern 109. The second connection metal pattern 109c is located on the inner side surface and the bottom surface of a first trench hole TRT1, which is formed through the first planarization film 107 so as to expose the first power supply voltage line 106c, and on the first planarization film 107 around the first trench hole TRT1. The second a connection metal pattern may be continuously provided in the first trench hole TRT1 and on the first planarization film 107. The second connection metal pattern 109c may be electrically connected to the voltage line provided thereunder, and forms a stack structure with the first power supply voltage line 106c under the second connection metal pattern 109c and the connection pattern 110a on the second connection metal pattern 109c, inside the first trench hole TRT1. In some cases, the second connection metal pattern 109c can be omitted, and a connection pattern 110a can be directly connected to the first power supply voltage line 106c.

A second trench hole TRT2 is formed through a position of the second planarization film 108, which overlaps the first trench hole TRT1, so as to expose the second connection metal pattern 109c, and the connection pattern 110a is located on the inner side wall of the second trench hole TRT2 and on the second connection metal pattern 109c inside the first trench hole TRT1.

The connection pattern 110a is formed through the same process as the anode 110 and an anode dummy pattern 110b. The connection pattern 110a can be provided so as to realize conductive connection with the first power supply voltage line 106c, and the anode dummy pattern 110b can be a pattern configured to inspect the surroundings of the active area AA or to realize connection with other signals.

The substrate 100 can have at least four corners, as shown in FIG. 1. The corners can have a curved shape, as shown in this figure, or a shape formed by two straight lines intersecting each other. A straight region can be provided between the two curved corners. As shown in FIG. 1, when the edge of the substrate 100 is curved at the corners thereof, the elements provided within the substrate 100 can also be curved at the corners thereof.

Although the second hole BCT is provided in an integral type within the non-active area NA except for the pad part PAD, the second hole BCT can have different widths depending on regions, as shown in FIG. 1. For example, the second hole BCT has a first width a in a region of the non-active area NA opposite the pad part PAD, has a second width b at corners of the non-active area NA connected to the region of the non-active area NA configured to have the first width a, has a third width c in regions of the non-active area NA connected to the corners of the non-active area NA configured to have the second width b and configured to correspond to both sides of the substrate 100, and has a fourth width d at corners of the non-active area NA connected to the regions of the non-active area NA configured to have the third width d and located most adjacent to the pad part PAD.

The second width b and the fourth width d of the second hole BCT at the corners of the non-active area NA are greater than the first width a and the third width c of the second hole BCT in the straight regions of the non-active area NA, and the reason for this is that the second hole BCT of the bank 120 overlaps the first and second trench holes TRT1 and TRT2 at the corners of the substrate 100 so as to realize direct conductive connection between the first power supply voltage line 106c and the connection pattern 110a through a plurality of organic films 120, 108 and 107. The first and second trench holes TRT1 and TRT2 may each have a width less than a width of the second hole BCT, and the first and second trench holes TRT1 and TRT2 may have different widths. Further, at the corners, the first and second trench holes TRT1 and TRT2 in regions adjacent to the gate drivers GIP embedded in the substrate 100 can be used as moisture release paths in the first and second planarization films 107 and 108, and in order to realize sufficient overlapping between the first and second trench holes TRT1 and TRT2 and the second hole BCT in these regions used as the moisture release paths, the widths of the second hole BCT at the corners can be greater than the widths of the second hole BCT in the straight regions.

The respective widths a, b, c and d of the second hole BCT can satisfy the following relations of:

$$a<c \text{(among the straight regions)} \text{ and}$$

$$b<d \text{(among the corners)}.$$

However, the respective widths a, b, c and d of the second hole BCT are not limited thereto. For example, the widths a and c of the second hole BCT in the straight regions can be equal, and the widths b and d of the second hole BCT at the corners can be equal.

Further, in the light emitting display device 1000 according to the present invention, the widths b and d of the second hole BCT even at the corners do not exceed 100 μm, and thus, penetration of moisture through the second hole BCT located close to the edge of the substrate 100 can be prevented. The significance of the widths of the second hole BCT will be given through a test which will be described below.

As shown in FIG. 3A, the light emitting device OLED includes the organic layers OS between the anode 110 and the cathode 200 provided opposite each other. The organic layers OS can include a hole injection layer HIL, a hole transport layer HTL, an emission layer EML and an electron transport layer ETL.

The cathode 200 includes the electron injection layer EIL formed thereunder so as to have a small thickness, and the electron injection layer EIL is formed of an inorganic material or an inorganic compound. For example, the cathode 200 and the electron injection layer EIL can be formed in the same chamber. In this case, a mask for forming the cathode 200 extends to the entirety of the active area AA and to the non-active area NA and has an opening in a region corresponding to at least the second hole BCT, and the electron injection layer EIL and the cathode 200 are formed by supplying a material through the opening of the mask. In this case, an electron injection material supply unit is further provided in addition to a metal material supply unit configured to supply a metal material for the cathode 200 within the chamber for forming the cathode 200, and the electronic injection layer ETL and the cathode 200 are sequentially formed by first evaporating an electron injection material from the electron injection material supply unit on the substrate 100 and then evaporating the metal material for the cathode 200 thereon.

The cathode metal material can be, for example, Mg, an Mg alloy, Ag or an Ag alloy, and realize reflective resonance with the anode 110, but the cathode metal material is not limited thereto and can include any transflective metal material which can transmit light under the optimum resonance conditions. Further, the electron injection material can be, for example, a compound including at least one of LiF, Yb, Ag and Mg. In order to increase the UV blocking effect and/or the electron injection effect, other inorganic materials can be further supplied.

The electron injection layer EIL according to the present invention is formed using the same mask inside the same chamber as the cathode 200, and can thus have the same end line as the cathode 200.

Further, the light emitting display device 1000 according to the present invention has the electron injection layer EIL formed to the same width as the cathode 200. Therefore, as shown in FIG. 3B, the electron injection layer EIL formed together with formation of the cathode 200 extends to the non-active area NA so as to cover the second hole BCT, thereby protecting the inside of the second hole BCT and the side configurations of the first and second trench holes TRT1 and TRT2 formed thereunder.

Compared to the configuration of the light emitting device OLED shown in FIG. 3A, the hole injection layer HIL, the hole transport layer HTL and the electron transport layer ETL, which are used as common layers in order to prevent electrical resistance when the first power supply voltage line 106c and the connection pattern 110a are connected, are not provided inside the second hole BCT in the non-active area NA shown in FIG. 3B.

The electron injection layer EIL is formed to have a thickness less than the thickness of the cathode 200, which is 50 Å to 300 Å, during the overall operation, and is formed under the cathode 200 to have a thickness less than or equal to approximately 20 Å. Further, because the electron injection layer EIL is formed using the same mask inside the same chamber as the cathode 200, the electron injection layer EIL has the same width and the same size as the cathode 200. Therefore, the electron injection layer EIL under the cathode 200 directly contacts the bank 120 at the side part of the second hole BCT, thereby being capable of preventing moisture penetration into the side part of the bank 120, which is exposed to the inside of the second hole BCT. For example, when moisture penetrates into the second hole BCT having a large width, the emission parts of the subpixels within the active area AA adjacent to the second hole BCT having the large width shrink, and thereby, the lifespan of the subpixels can be shortened. Therefore, in the light emitting display device 1000 according to the present invention, the width of the second hole BCT, which can cause moisture penetration, is reduced to be less than or equal to a designated value, and the electron injection layer EIL under the cathode 200 extends to correspond to the second hole BCT, thereby being capable of protecting the second hole BCT.

The electron injection layer EIL under the cathode 200 is located on the connection pattern 110a and the second connection metal pattern 109c at the side parts of the second trench hole TRT2 and the first trench hole TRT1 inside the second hole BCT, thereby being capable of protecting the first and second planarization films 107 and 108 in the lower portion of the second hole BCT from exposure and external moisture.

Hereinafter, the significance of the width of the second hole BCT and the thickness of the electron injection layer EIL will be described through a highly accelerated stress test (HAST).

In the HAST, a light emitting display device is placed under severe conditions, such as a temperature of 110° C., a humidity of 85% and an atmospheric pressure of 1.2 atm for a designated time, and in a test example, the HAST was performed for 48 hours and 96 hours.

TABLE 1

| Width of second hole (μm) | Thickness of EIL (Å) | Failure after HAST for 48 hours | Failure after HAST for 96 hours |
|---|---|---|---|
| 180 | EIL ≤ 9 Å | 30/30 | — |
|  | EIL > 9 Å | 30/30 | — |
| 102 | EIL ≤ 9 Å | 30/30 | — |
|  | EIL > 9 Å | 30/30 | — |
| 80 | EIL ≤ 9 Å | 0/30 | 23/30 |
|  | EIL > 9 Å | 0/30 | 0/30 |

For reference, in Table 1, the HAST was performed 30 times under respective conditions, whether or not failure occurs was determined, and the number of attempts of the HAST on which failure occurs was recorded.

As set forth in Table 1 above, it can be confirmed that, when the width of the second hole BCT is greater than or equal to 102 μm, failure occurs on all attempts of the HAST for 48 hours regardless of the thickness of the electron injection layer EIL.

Further, it can be confirmed that, when the width of the second hole BCT is 80 μm, no failure occurs on all attempts of the HAST for 48 hours regardless of the thickness of the electron injection layer EIL, and failure occurs on some attempts of the HAST for 96 hours when the thickness of the electron injection layer EIL is less than or equal to 9 Å and no failure occurs on all attempts of the HAST for 96 hours when the thickness of the electron injection layer EIL exceeds 9 Å.

The HAST is a test in which a light emitting display device is accelerated by assuming severe conditions under which the light emitting display device will be placed after shipment, and when each product passes the HAST for 48 hours, it can be determined that a corresponding light emitting display device has appropriate reliability.

The results of Table 1 above show that, as the width of the second hole BCT is decreased, and, when the thickness of the electron injection layer EIL exceeds 9 Å or is 9 Å in some cases, the light emitting display device has reliability even in a high-temperature and high-humidity situation. Based on the above-described results, it can be confirmed that, when the width of the second hole BCT is greater than or equal to 102 μm, it is difficult for the light emitting display device to remain normal under high-temperature and high-humidity accelerated conditions.

Hereinafter, results of the HAST performed by fixing the width of the second hole BCT to 100 μm and varying the thickness of the electron injection layer EIL in test examples 1 to 7, as stated in Table 2 below, will be described.

TABLE 2

| Classification | Thickness of EIL (Å) | Failure after HAST for 48 hours | Failure after HAST for 96 hours |
| --- | --- | --- | --- |
| 1st test example | 5 | 30/30 | — |
| 2nd test example | 8 | 0/30 | 10/30 |
| 3rd test example | 9 | 0/30 | 0/30 |
| 4th test example | 10 | 0/30 | 0/30 |
| 5th test example | 11 | 0/30 | 0/30 |
| 6th test example | 12 | 0/30 | 0/30 |
| 7th test example | 15 | 0/30 | 0/30 |

As set forth in Table 2 above, it can be confirmed that, in Test Examples 3 to 7 in which the thickness of the electron injection layer EIL is greater than or equal to 9 Å, when the HAST was performed for 48 hours and for 96 hours, no failure of light emitting display devices occurred. For reference, in Table 2, the HAST was performed 30 times under respective conditions, whether or not failure occurs was determined, and the number of attempts of HAST on which failure occurs was recorded.

In Test Examples 1 and 2 in which the thickness of the electron injection layer EIL is less than 9 Å, causes of occurrence of failure are as follows.

For example, when the thickness of the electron injection layer EIL is less than 9 Å, it is difficult to normally stack the electron injection layer EIL on the inner surface of the second hole BCT, and in this case, external moisture or moisture generated during cooling damages the organic layers OS at the edge of the active area AA via the bank 120 adjacent to the second hole BCT through the side part of the second hole BCT and thus degrades the organic layers OS, and this is observed as shrinkage of the emission part.

Based on the above-described results, the thickness of the electron injection layer EIL of the light emitting display device 1000 according to the present invention can be greater than or equal to 9 Å, but can be less than or equal to 20 Å. For example, the light emitting display device 1000 according to the present invention is configured so that the electron injection layer EIL in the second hole BCT, to which the bank 120 is exposed, has a thickness greater than or equal to 9 Å so as to secure reliability in a high-temperature and high-humidity situation, and the electron injection layer EIL has a thickness less than or equal to 20 Å so as to prevent a large increase in resistance to conductive connection between the cathode 200 on the electron injection layer EIL and the first power supply voltage line 106c.

A capping layer configured to protect the light emitting devices OLED and to improve the light extraction effect can be further provided on the cathode 200.

Further, an encapsulation structure 300 configured to protect the light emitting devices OLED provided therein can be further provided on the cathode 200.

The encapsulation structure 300 can be provided, for example, by alternately stacking inorganic encapsulation layers 310 and 330 and an organic encapsulation layer 320. In order to effectively prevent lateral moisture penetration, the inorganic encapsulation layers 310 and 330 can be formed closer to the edge of the substrate 100 than the organic encapsulation layer 320, or can be formed up to the edge of the substrate 100.

The light emitting display device 1000 according to the present invention enables the electron injection layer EIL to enter the second hole BCT of the bank 120 corresponding to the first power supply voltage line 106c, thereby being capable of protecting the exposed surface of the bank 120 from external moisture.

Further, the light emitting display device 1000 according to the present invention sets the width of the second hole BCT of the bank 120 provided outside the active area AA of the substrate 100 to be less than or equal to a designated value in order to connect the first power supply voltage line 106c formed together with formation of the thin film transistor array to the cathode 200 of the light emitting devices OLED, and thus prevents moisture from penetrating into the bank 120 through the second hole BCT, thereby being capable of preventing pixel shrinkage in which the emission parts of the subpixels located close to the edge of the substrate 100 shrink.

In addition, the light emitting display device 1000 according to the present invention enables the electron injection layer EIL, which is formed together with formation of the cathode 200 among common layers of the light emitting devices, to be formed of a metal or a metal compound and to extend to the non-active area NA so as to overlap the second hole BCT of the bank 120, and thus, the electron injection layer EIL is connected to the first power supply voltage line 106c inside the second hole BCT of the bank 120. Thereby, the electron injection layer EIL formed of a metal component covers the inside of the second hole BCT of the bank 120 and serves as a barrier to moisture, thus preventing an organic component from being exposed laterally in the non-active area and improving the reliability of the light emitting display device 1000.

Moreover, the light emitting display device 1000 according to the present invention enables the second hole BCT of the bank 120 provided in the non-active area NA to have different widths at the curved regions and the straight regions of the non-active area NA, but the widths of the second hole BCT even in the curved regions are set to be less than or equal to 100 μm so as to shorten the length of a moisture transmission path and to allow electrode and metal components to cover the inner surface of the second hole BCT and the inner surfaces of the organic films formed thereunder, thereby increasing the resistance of the light emitting display device 1000 to heat and moisture and thus improving the reliability of the light emitting display device 1000.

In the light emitting display device 1000 according to the present invention, the light emitting devices OLED are not limited to the above-described single stack structure, and can be applied to a structure including a plurality of stacks.

Figure 4A:
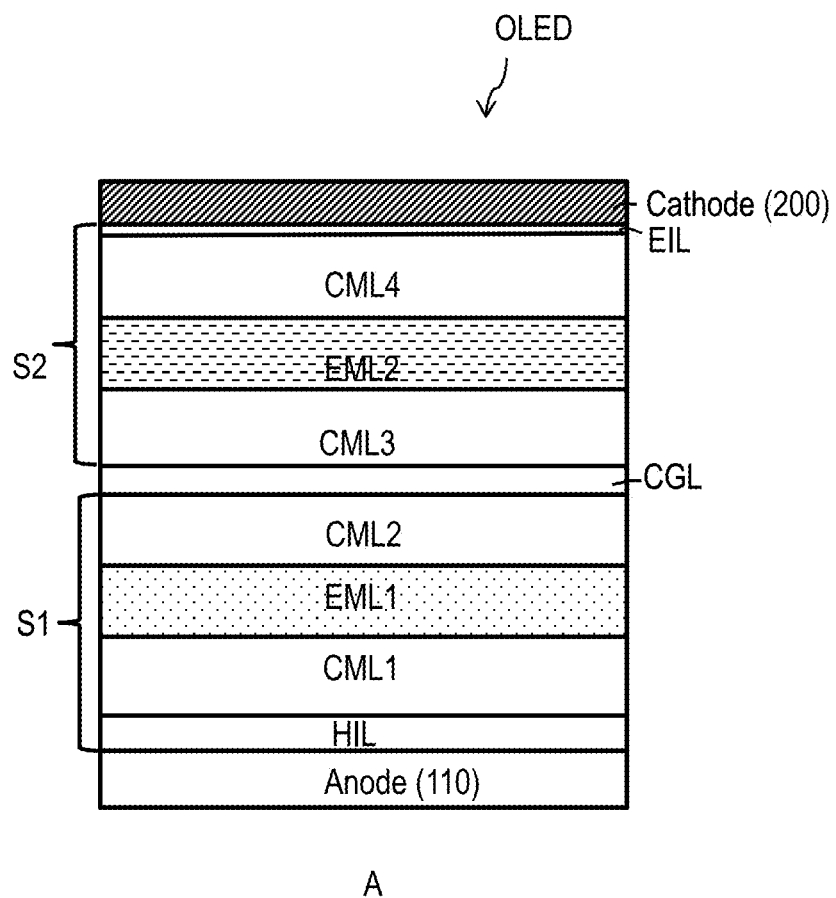
FIGS. 4A and 4B are cross-sectional views illustrating a region A and a region B shown in FIG. 2, respectively, of a light emitting display device according to another embodiment of the present invention.
Figure 4B:

FIGS. 4A and 4B are cross-sectional views respectively illustrating a region A and a region B shown in FIG. 2 of a light emitting display device according to another embodiment of the present invention.

As shown in FIG. 4A, in the light emitting display device according to another embodiment of the present invention, a light emitting device (e.g., OLED or organic light emitting diode) provided in each of subpixels can include at least two stacks S1 and S2 and a charge generation layer CGL provided between the stacks S1 and S2.

Among the respective stacks S1 and S2, a first stack S1 close to an anode 110 can include a hole injection layer HIL, a first common layer CML1, a first emission layer EML1 and a second common layer CML2.

A second stack S2 close to a cathode 200 can include a third common layer CML3, a second emission layer EML2, a fourth common layer CML4 and an electron injection layer EIL.

The first common layer CML1 and the third common layer CML3 can be layers relating to hole transport and include at least one of a hole transport layer, an electron barrier layer and the like, and the second common layer CML2 and the fourth common layer CML4 can be layers relating to electron transport and include at least one of a hole blocking layer, an electron transport layer and the like.

In some cases, other stacks can be further provided in addition to the stacks S1 and S2 shown in FIG. 4A. For example, the stack can include a hole transport layer, an emission layer and an electron transport layer. When two or more stacks are provided, a charge generation layer can be further provided between the respective stacks so as to supply holes and electrons to a stack far away from an electrode.

Further, as shown in FIG. 4B, also in the light emitting display device according to another embodiment of the present invention, the elements S1, S2 and CGL formed of organic materials are not provided in a second hole BCT. Inside the second hole BCT, the electron injection layer EIL formed of an inorganic material or an inorganic compound and the cathode 200 are directly stacked on a first connection pattern 110a formed of an anode component. Therefore, a hole transport layer and an electron transport layer having relatively great resistance are not provided inside the second hole BCT, and thus, an electrical signal can be smoothly transmitted from a first power supply voltage line 106c to the cathode 200 without great resistance.

The light emitting devices OLED provided in the active area AA can be configured so that white light emitting devices can be formed in all of the subpixels and color filters are respectively formed at the exit sides of the subpixels so as to vary colors of emitted light depending on the respective subpixels, or emission layers to emit light with different colors can be provided in the respective subpixels so as to express the different colors depending on the subpixels.

Hereinafter, the significance of the operation of subpixels and a ground signal and a low-power supply voltage signal applied to the cathode 200 will be descried with reference to the circuit diagram of each subpixel.

Figure 5:
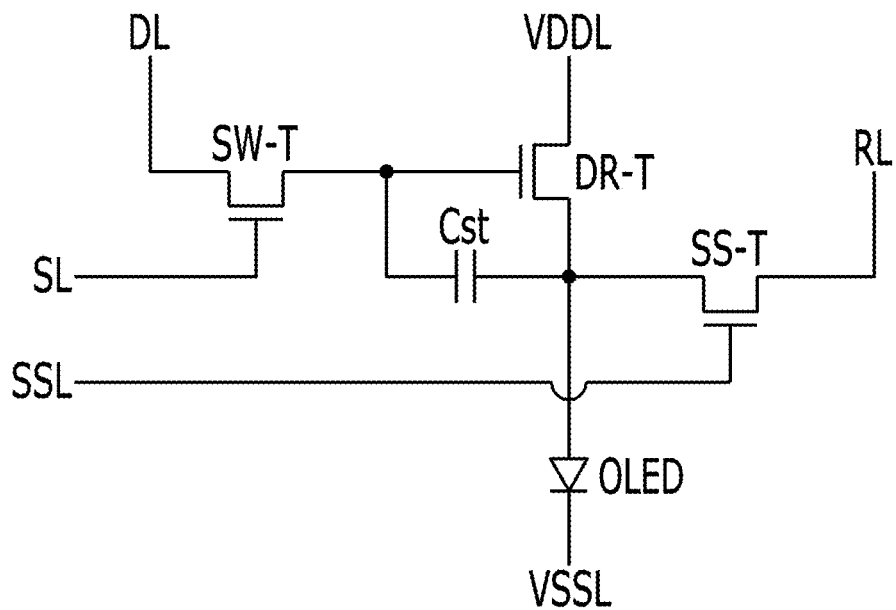
FIG. 5 is a circuit diagram of an example of each subpixel of the light emitting display device according to one embodiment of the present invention.

FIG. 5 is a circuit diagram of each subpixel of the light emitting display device according to one embodiment of the present invention. The structure of the subpixel of FIG. 5 can be applied to any subpixel of the light emitting display device according to all embodiments of the present invention.

Each subpixel of the light emitting display device according to the present invention can include, for example, a light emitting device OLED, a driving thin film transistor DR-T, a switching thin film transistor SW-T, a sensing thin film transistor SS-T and a storage capacitor Cst, as shown in FIG. 5.

In the light emitting display device according to the present invention, the driving thin film transistor DR-T, the switching thin film transistor SW-T, the sensing thin film transistor SS-T and the storage capacitor Cst are structurally located under the light emitting device OLED.

The light emitting device OLED emits light using current supplied through the driving thin film transistor DR-T. The anode of the light emitting device OLED can be connected to a first electrode (it may be a source electrode of the driving thin film transistor DR-T) (e.g., 106a in FIG. 2) of the driving thin film transistor DR-T (e.g., TFT in FIG. 2), and the cathode of the light emitting device OLED can be connected to a first power supply voltage line VSSL to which a first power supply voltage is supplied. The first power supply voltage line VSSL can be a low voltage line to which a low-power supply voltage is supplied, or a ground voltage line.

The light emitting device OLED includes the anode (e.g., 110 in FIG. 2), the organic layers (e.g., OS in FIG. 2), and the cathode (e.g., 200 in FIG. 2). In the light emitting device OLED, when voltage is applied to the anode and the cathode, holes and electrons are moved to the emission layer, and are then combined in the emission layer, thereby emitting light.

The driving thin film transistor DR-T is disposed between a second power supply voltage line VDDL, to which a second power supply voltage is supplied, and the light emitting device OLED. The driving thin film transistor DR-T regulates the current flowing from the second power supply voltage line VDDL to the light emitting device OLED according to a voltage difference between a gate electrode and the source electrode of the driving thin film transistor DR-T (it may be the first electrode). The gate electrode of the driving thin film transistor DR-T can be connected to a source electrode of the switching thin film transistor SW-T (the source electrode of the switching is a third electrode hereinafter), the drain electrode of the driving thin film transistor DR-T (the drain electrode of the driving thin film transistor is a second electrode hereinafter) can be connected to the second power supply voltage line VDDL, and the first electrode (the source electrode of the driving thin film transistor DR-T) can be connected to the anode of the light emitting device OLED. The second power supply voltage line VDDL can be a high voltage line to which a high-power supply voltage is supplied.

The switching thin film transistor SW-T is turned on by a gate signal from a scan line, and supplies the voltage of a data line DL to the gate electrode of the driving thin film transistor DR-T. A gate electrode of the switching thin film transistor SW-T can be connected to the switching line SL, the third electrode (the source electrode of the switching thin film transistor SW-T) can be connected to the gate electrode of the diving thin film transistor DR-T, and a drain electrode of the switching thin film transistor SW-T which is named as a fourth electrode can be connected to the data line DL.

The sensing thin film transistor SS-T is turned on by an initiation signal from a sensing line SSL, and connects a reference voltage line RL to the first electrode (the source electrode of the driving thin film transistor DR-T). A gate electrode of the sensing thin film transistor SS-T can be connected to the sensing line SSL, a drain electrode of the sensing thin film transistor SS-T (it is named as a sixth electrode) can be connected to the reference voltage line RL, and a source electrode of the sensing thin film transistor SS-T (it is named as a fifth electrode) can be connected to the first electrode (the source electrode of the driving thin film transistor DR-T).

The storage capacitor Cst is formed between the gate electrode and the first electrode (the source of the driving thin film transistor DR-T). The storage capacitor Cst stores a difference between a gate voltage and a source voltage of the driving thin film transistor DR-T.

One electrode of the storage capacitor Cst can be connected to the gate electrode of the driving thin film transistor DR-T and the source electrode of the switching thin film transistor SW-T, and the other electrode of the storage capacitor Cst can be connected to the first electrode (the source electrode of the driving thin film transistor DR-T), the fifth electrode (the source electrode of the sensing thin film transistor SS-T) and the anode of the light emitting device OLED.

The driving thin film transistor DR-T, the switching thin film transistor SW-T and the sensing thin film transistor SS-T of each of the subpixels can be formed as thin film transistors on a substrate. Although FIG. 5 exemplarily illustrates the driving thin film transistor DR-T, the switching thin film transistor SW-T and the sensing thin film transistor SS-T of each of the subpixels as N-type semiconductor transistors having characteristics of an N-type semiconductor, the embodiments of the present invention are not limited thereto. For example, the driving thin film transistor DR-T, the switching thin film transistor SW-T and the sensing thin film transistor SS-T of each of the subpixels can be formed as P-type semiconductor transistors having characteristics of a P-type semiconductor. When the driving thin film transistor DR-T, the switching thin film transistor SW-T and the sensing thin film transistor SS-T of each of the subpixels are formed as P-type semiconductor transistors, the directions of a source electrode and a drain electrode of each of the thin film transistors can be opposite to those of an N-type semiconductor transistor. For an example, contrary to the previously described, a drain electrode of the driving thin film transistor DR-T may be connected to the light emitting device OLED. In the light emitting display device according to the present invention, the thin film transistors are not limited to the N-type or P-type semiconductor transistors.

In the light emitting display device according to any of the embodiments of the present invention, each subpixel can include the above-described circuit shown in FIG. 5, and in some cases, can employ a 2T1C structure, in which the sensing thin film transistor is omitted, or can further include an additional transistor configured to exhibit a compensation function. The light emitting display device according to the present invention effectively prevents pixel shrinkage by changing the structure of the device outside the active area, and is not limited in terms of the inner structures of the subpixels.

Figure 6:
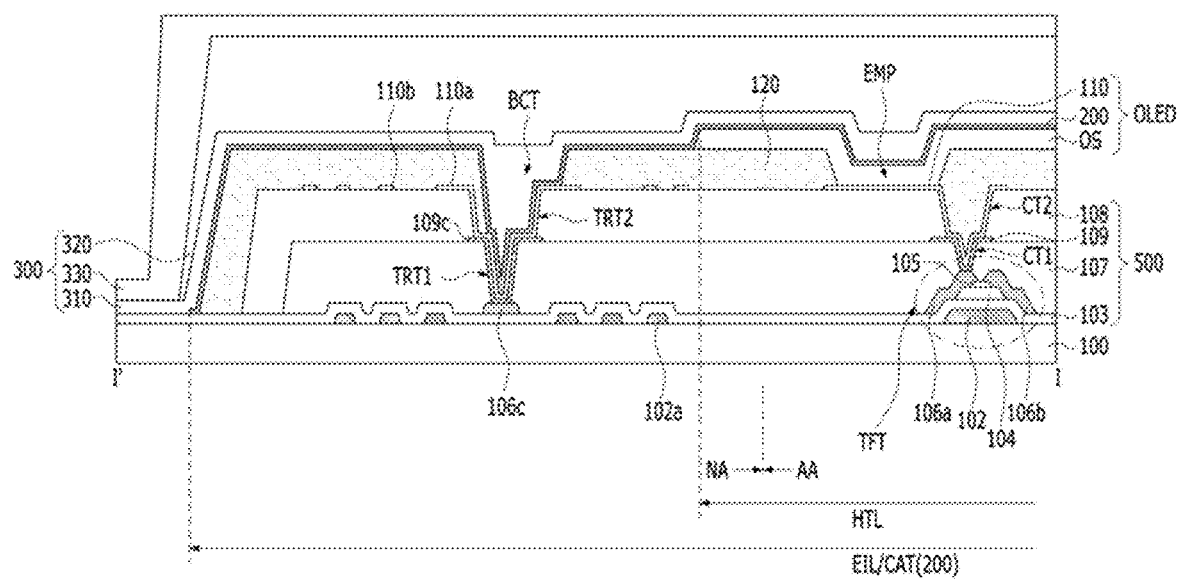
FIG. 6 is a cross-sectional view of a straight region having a width c shown in FIG. 1.

FIG. 6 is a cross-sectional view of the straight region having the width c shown in FIG. 1.

As shown in FIG. 6, in the light emitting display device according to an example of the present invention, the second hole BCT of the bank 120 formed at both sides the non-active area outside the active area AA, which do not correspond to the pad part, can be formed into the straight region having the small width c shown in FIG. 1.

Hereinafter, various modified examples of the light emitting display device according to the present invention will be described.

Figure 7:
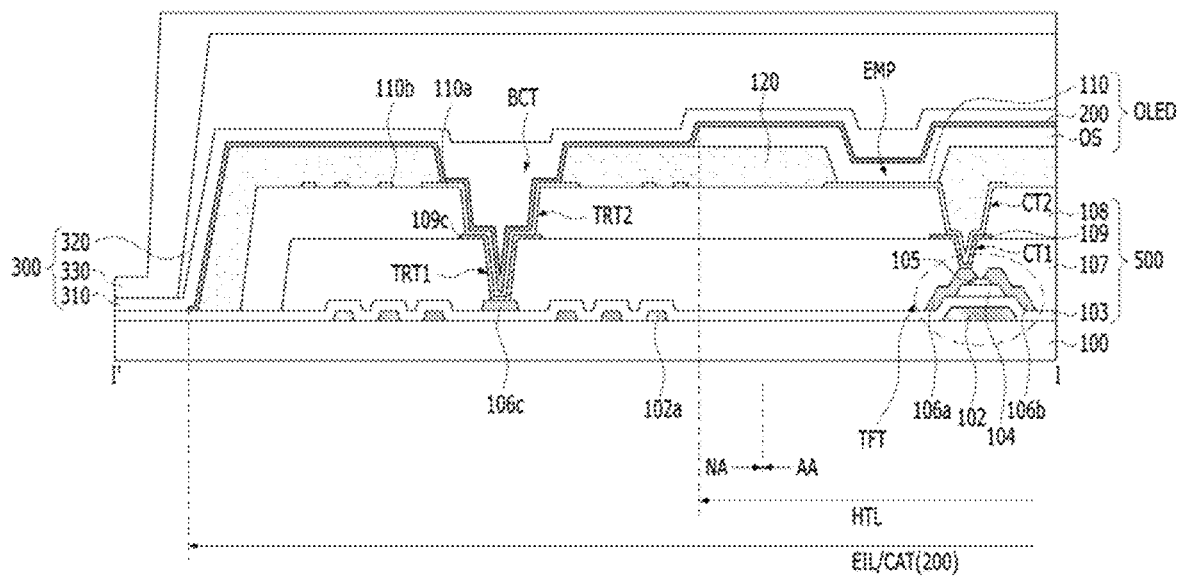
FIGS. 7 and 8 are cross-sectional views illustrating modified examples of the light emitting display device according to the present invention.
Figure 8:
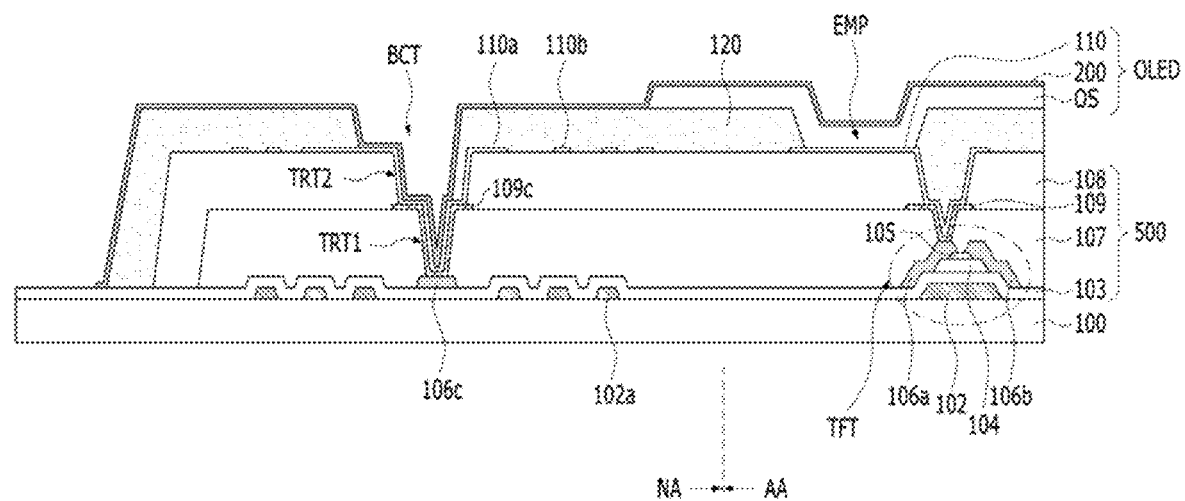

FIGS. 7 and 8 are cross-sectional views illustrating the modified examples of the light emitting display device according to the present invention.

In one modified example of the light emitting display device according to the present invention shown in FIG. 7, the second hole BCT can be formed to be bilaterally symmetrical with respect to the connection pattern 110a. In this case, the electron injection layer EIL can also be provided under the cathode 200 so as to prevent moisture penetration into the side wall of the second hole BCT.

In another modified example of the light emitting display device according to the present invention shown in FIG. 8, the width of the second hole BCT of the bank 120 corresponding to the first power supply voltage line 106c at the corners of the substrate 100 is reduced similarly to the straight regions of the substrate 100. In this case, all of the widths of the second hole BCT of the bank 120 at the respective sides of the substrate 100 except for the pad part shown in FIG. 1 can be set to be less than or equal to 100 μm, and the second hole BCT of the bank 120 can be configured to have the same width or similar widths regardless of the regions of the substrate 100. Here, the electron injection layer EIL is located under the cathode 200 inside the second hole BCT, and thus covers the exposed side and upper parts of the bank 120, thereby being capable of preventing moisture penetration into the bank 120 formed of an organic material.

In the light emitting display device according to another embodiment the present invention shown in FIG. 8, the second hole BCT of the bank 120 is formed to be open at a position farther from the active area AA than the trench holes TRT1 and TRT2. In this case, the electron injection layer EIL can be located on the upper surface of the connection pattern 110a so that all of the widths of the second hole BCT of the bank 120 at the respective sides of the substrate 100 are set to be less than or equal to 100 μm, and the second hole BCT of the bank 120 has the same width or similar widths regardless of the regions of the substrate 100, thereby being capable of preventing moisture penetration via the bank 120 as a path and thus blocking moisture transmission to the active area AA.

Figure 9:
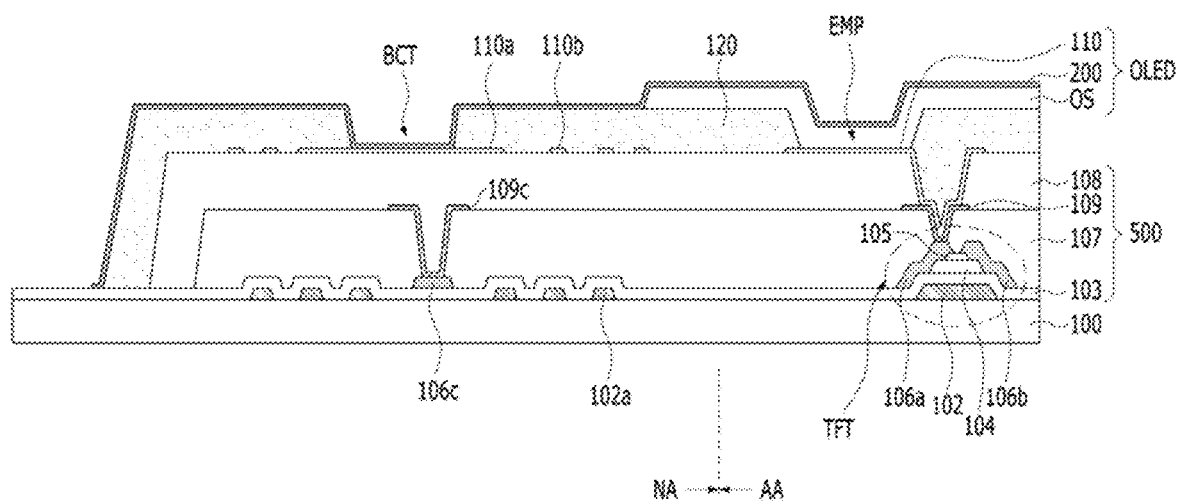
FIG. 9 is a cross-sectional view illustrating one example of a region in which a second hole (e.g., BCT) shown in FIG. 1 traverses a part of a bank having a third width.

FIG. 9 is a cross-sectional view illustrating one example of a region in which the second hole shown in FIG. 1 traverses the part of the bank having the third width c.

As shown in FIG. 9, the first power supply voltage line 106c and the second connection metal pattern 109c connected thereto may not be directly connected to the electron injection layer EIL or the cathode 200 in some regions of the second hole (bank hole) BCT, for example, in the region of the second hole (bank hole) BCT having a small width. In this case, the second connection metal pattern 109c can be conductively connected to the connection pattern 110a through a second trench hole formed through the second planarization film 108 in a region which does not overlap the second hole BCT. For example, the second hole BCT and the second trench hole may not overlap with each other.

In a light emitting display device having the structure of FIG. 9, the electron injection layer EIL is also provided under the cathode 200, thereby being capable of protecting the side and upper parts of the bank 120 through the second hole BCT and a region therearound, and preventing external moisture from penetrating into the bank 120.

In the light emitting display devices of FIGS. 8 and 9, for example, a structure provided on the cathode 200 can be omitted. The encapsulation structure 300 shown in FIG. 2, formed by alternately stacking the inorganic encapsulation layers 310 and 330 and the organic encapsulation layer 320, can be further provided on the cathode 200, or an encapsulation substrate can be bonded to the substrate 100 or the thin film transistor array substrate 500 by applying a face seal or an edge seal therebetween.

For this purpose, a light emitting display device according to one or more embodiments of the present invention can include a substrate configured to have an active area and a non-active area, a plurality of light emitting devices provided in subpixels within the active area, a voltage line provided within the non-active area along an edge of the active area of the substrate, and a bank configured to expose emission parts of the light emitting devices through a plurality of first holes formed in the active area and to expose the voltage line through a second hole formed in the non-active area, and an electron injection layer of the light emitting devices can be provided throughout the active area and extend to the non-active area so as to be provided inside the second hole.

Each of the light emitting devices can include an anode, a hole injection layer, a hole transport layer, an emission layer, an electron transport layer, the electron injection layer and a cathode, configured to be sequentially stacked.

The cathode can be provided on the electron injection layer, within the non-active area, and the voltage line can be connected to the cathode with the electron injection layer interposed therebetween, inside the second hole.

The second hole can be provided in an integral type within the non-active area except for a pad part.

Edges of at least four corners of the substrate can be curved, edges between the corners can be straight, the second hole can have a first width in regions thereof configured to be parallel to the curved regions of the substrate and have a second width in regions thereof configured to be parallel to the straight regions of the substrate, and an edge of the bank can be located farther inward than an edge of the substrate.

The first width can be less than or equal to 100 μm.

The electron injection layer can be connected to the voltage line through the second hole, and can come into contact with the bank at side and upper parts of the second hole within the non-active area.

An end line of the electron injection layer can be located farther outward than the second hole in the non-active area.

The electron injection layer can include a metal or a metal compound, and can have a thickness of 9 Å to 20 Å.

The electron injection layer can include at least one of LiF, Yb, Ag and Mg.

The light emitting display device can further include a connection pattern formed in a same layer as the anode so as to overlap the second hole, and the connection pattern can be connected to the voltage line provided thereunder and be connected to the electron injection layer provided thereon.

The light emitting display device can further include a first planarization film and a second planarization film provided between the voltage line and the bank, and each of the first and second planarization films can include a trench hole configured to overlap the second hole and to have a width less than a width of the second hole.

The first planarization film can include a first trench hole, the second planarization film can include a second trench hole, the first and second trench holes can have different widths, and at least one of the first trench hole and the second trench hole can be configured so that a portion thereof farther from the active area than the second hole is open.

The light emitting display device can further include a connection metal pattern continuously provided in the first trench hole and on the first planarization film, and the connection metal pattern can be conductively connected to the voltage line provided thereunder and form a stack structure with the voltage line inside the first trench hole.

An end line of the electron injection layer and an end line of the cathode can be equal.

The second hole can be spaced apart from the first holes.

As is apparent from the above description, a light emitting display device according to the present invention has the following effects.

First, the light emitting display device according to the present invention sets the width of a second hole formed in a bank provided outside the active area of a substrate to be less than or equal to a designated value in order to connect a power supply voltage line formed together with formation of a thin film transistor array to the cathode of light emitting display devices, and thus prevents moisture from penetrating into the bank through the second hole, thereby being capable of preventing pixel shrinkage in which the emission parts of the subpixels located close to the edge of the substrate shrink.

Second, the light emitting display device according to the present invention enables an electron injection layer EIL, which is formed together with formation of the cathode among common layers of the light emitting devices, to be formed of a metal or a metal compound and to extend to the non-active area of the substrate so as to overlap the second hole of the bank, and thus, the electron injection layer is connected to the first power supply voltage line inside the second hole of the bank. Thereby, the electron injection layer formed of a metal component covers the inside of the second hole of the bank and serves as a barrier to moisture, thus preventing an organic component from being exposed laterally in the non-active area and improving the reliability of the light emitting display device.

Third, the light emitting display device according to the present invention enables the second hole of the bank provided in the non-active area NA to have different widths at curved regions and straight regions of the non-active area, but the widths of the second hole even in the curved regions are set to be less than or equal to 100 μm so as to shorten the length of a moisture transmission path and to allow electrode and metal components to cover the inner surface of the second hole and the inner surfaces of organic films formed thereunder, thereby increasing the resistance of the light emitting display device to heat and moisture and thus improving the reliability of the light emitting display device.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A light emitting display device comprising:
   a substrate having an active area and a non-active area surrounding the active area, wherein the non-active area is positioned between the active area and an end line of the substrate;
   a plurality of light emitting devices provided in subpixels within the active area;
   a voltage line provided within the non-active area along an edge of the active area of the substrate; and
   a bank to expose emission parts of the light emitting devices through a plurality of first holes at the active area and to expose the voltage line through a second hole at the non-active area,
   wherein an electron injection layer is provided throughout the active area,
   wherein the electron injection layer extends to the non-active area to be provided inside the second hole and covers an edge of the bank adjacent to the end line of the substrate, and
   wherein the electron injection layer overlaps and entirely covers an exposed surface of the voltage line exposed by the bank in the second hole.

2. The light emitting display device according to claim 1, wherein each of the light emitting devices comprises an anode, a hole injection layer, a hole transport layer, an emission layer, an electron transport layer, the electron injection layer and a cathode, all configured to be sequentially stacked, and
wherein the hole injection layer, the hole transport layer and the electron transport layer are not overlapped with the second hole at the non-active area.

3. The light emitting display device according to claim 2, wherein:
the cathode is provided on the electron injection layer, within the non-active area; and
the voltage line is connected to the cathode with the electron injection layer interposed therebetween, inside the second hole.

4. The light emitting display device according to claim 1, wherein the second hole is continuously provided along the end line of the substrate at the non-active area, except at a pad part of the substrate.

5. The light emitting display device according to claim 4, wherein:
edges of at least some corners of the substrate have curved regions, and edges between adjacent corners have straight regions;
the second hole has a first width in regions to be parallel to the curved regions of the substrate, and has a second width in regions to be parallel to the straight regions of the substrate;
the edge of the bank is located farther inwardly than the edges of the substrate; and
the first width is greater than the second width.

6. The light emitting display device according to claim 5, wherein the first width of the second hole is less than or equal to approximately 100 μm.

7. The light emitting display device according to claim 1, wherein the electron injection layer is connected to the voltage line through the second hole, and comes into contact with the bank at a side of the second hole and an upper part of the bank within the non-active area.

8. The light emitting display device according to claim 1, wherein an end line of the electron injection layer is located farther outwardly than the edge of the bank at the non-active area.

9. The light emitting display device according to claim 1, wherein:
the electron injection layer comprises a metal or a metal compound; and
the electron injection layer has a thickness of approximately 9 Å to 20 Å.

10. The light emitting display device according to claim 9, wherein the electron injection layer comprises at least one of LiF, Yb, Ag and Mg.

11. The light emitting display device according to claim 2, further comprising a connection pattern in a same layer as the anode to overlap the second hole,
wherein the connection pattern is connected to the voltage line provided thereunder, and is connected to the electron injection layer provided thereon.

12. The light emitting display device according to claim 11, further comprising a first planarization film and a second planarization film provided between the voltage line and the bank,
wherein each of the first and second planarization films comprises a trench hole to overlap the second hole and to have a width less than a width of the second hole.

13. The light emitting display device according to claim 12, wherein the first planarization film comprises a first trench hole, the second planarization film comprises a second trench hole, and the first and second trench holes have different widths, and
wherein the second hole is formed to be open at a position farther from the active area than at least one of the first trench hole and the second trench hole.

14. The light emitting display device according to claim 13, further comprising a connection metal pattern continuously provided in the first trench hole and on the first planarization film,
wherein the connection metal pattern is electrically connected to the voltage line provided thereunder, and forms a stack structure with the voltage line under the connection metal pattern and the connection pattern on the connection metal pattern, inside the first trench hole.

15. The light emitting display device according to claim 2, wherein an end line of the electron injection layer and an end line of the cathode are equal.

16. The light emitting display device according to claim 1, wherein the second hole is spaced apart from the first holes.

17. The light emitting display device according to claim 1, wherein an electron injection layer of the light emitting devices overlaps the second hole and covers the inside of the second hole.

18. The light emitting display device according to claim 1, wherein the light emitting devices include a cathode disposed on the electron injection layer, wherein the electron injection layer is formed to have a thickness less than a thickness of the cathode, and to have a same width as the cathode such that the electron injection layer under the cathode directly contacts the bank at a side part of the second hole.

19. The light emitting display device according to claim 11, wherein the second hole is formed to be symmetrical with respect to the connection pattern.

20. The light emitting display device according to claim 1, further comprising a connection metal pattern connected to the voltage line, a connection pattern and a first planarization film and a second planarization film provided between the voltage line and the bank, wherein the first planarization film includes a first trench hole, and the second planarization film includes a second trench hole formed through a position of the second planarization film which overlaps the first trench hole, so as to expose the connection metal pattern, wherein the connection metal pattern is conductively connected to the connection pattern through the second trench hole in a region which does not overlap the second hole.

21. A light emitting display device comprising:
a substrate having an active area and a non-active area surrounding the active area, wherein the non-active area is positioned between the active area and an end line of the substrate;
a plurality of light emitting devices provided in subpixels within the active area;
a voltage line provided within the non-active area along an edge of the active area of the substrate; and
a bank to expose emission parts of the light emitting devices through a plurality of first holes at the active area and to expose the voltage line through a second hole at the non-active area,
wherein an electron injection layer is provided throughout the active area, wherein the electron injection layer extends to the non-active area to be provided inside the second hole and covers an edge of the bank adjacent to the end line of the substrate, wherein each of the light emitting devices comprises an anode, a hole injection layer, a hole transport layer, an emission layer, an electron transport layer, the electron injection layer and a cathode, all configured to be sequentially stacked, and wherein the hole injection layer, the hole transport layer and the electron transport layer are not overlapped with the second hole at the non-active area.

22. A light emitting display device comprising:

a substrate having an active area and a non-active area surrounding the active area, wherein the non-active area is positioned between the active area and an end line of the substrate;

a plurality of light emitting devices provided in subpixels within the active area;

a voltage line provided within the non-active area along an edge of the active area of the substrate; and a bank to expose emission parts of the light emitting devices through a plurality of first holes at the active area and to expose the voltage line through a second hole at the non-active area, wherein an electron injection layer is provided throughout the active area, wherein the electron injection layer extends to the non-active area to be provided inside the second hole and covers an edge of the bank adjacent to the end line of the substrate, and wherein the second hole is continuously provided along the end line of the substrate at the non-active area, except at a pad part of the substrate.

* * * * *